(12) United States Patent
Ikawa (10) Patent No.: US 8,186,050 B2
(45) Date of Patent: May 29, 2012

(54) PRINTED WIRING BOARD MANUFACTURING METHOD

(75) Inventor: Yuji Ikawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/847,256

(22) Filed: Jul. 30, 2010

(65) Prior Publication Data

US 2011/0131806 A1 Jun. 9, 2011

Related U.S. Application Data

(60) Provisional application No. 61/266,732, filed on Dec. 4, 2009.

(51) Int. Cl.
*H05K 3/10* (2006.01)
(52) U.S. Cl. ............... 29/846; 29/830; 29/833; 29/840
(58) Field of Classification Search ............. 29/720, 29/721, 832, 833, 840, 830, 846
See application file for complete search history.

(56) References Cited

U.S. PATENT DOCUMENTS

| | | | | |
|---|---|---|---|---|
| 4,783,826 A | * | 11/1988 | Koso | 382/147 |
| 4,799,175 A | * | 1/1989 | Sano et al. | 382/151 |
| 4,928,313 A | * | 5/1990 | Leonard et al. | 382/149 |
| 6,237,218 B1 | * | 5/2001 | Ogawa et al. | 29/830 |
| 6,389,688 B1 | * | 5/2002 | Srivastava et al. | 29/833 |

FOREIGN PATENT DOCUMENTS

| | | |
|---|---|---|
| JP | 2004-214247 | 7/2004 |
| JP | 2006-035140 | 8/2007 |
| JP | 2007-214494 | 8/2007 |

* cited by examiner

*Primary Examiner* — Carl Arbes
(74) *Attorney, Agent, or Firm* — Oblon, Spivak, McClelland & Neustadt, L.L.P.

(57) ABSTRACT

A method for recognizing alignment marks includes preparing a substrate having multiple alignment marks including alignment marks positioned adjacent to each other, and recognizing the alignment marks on the substrate by capturing images of the alignment marks using a recognition camera. The recognizing of the alignment marks includes adjusting the position of the recognition camera when capturing images of the alignment marks positioned adjacent to each other such that each of the alignment marks positioned adjacent to each other is positioned equidistant from the center of an image-capturing region of the recognition camera.

4 Claims, 13 Drawing Sheets

PRINTED WIRING BOARD MANUFACTURING METHOD

CROSS-REFERENCE TO RELATED APPLICATIONS

The present application claims the benefits of priority to U.S. Application No. 61/266,732, filed Dec. 4, 2009. The contents of that application are incorporated herein by reference in their entirety.

BACKGROUND OF THE INVENTION

1. Field of the Invention

The present invention relates to a method for recognizing alignment marks and to a method for manufacturing a printed wiring board.

2. Discussion of the Background

In Japanese Laid-Open Patent Publication 2004-214247, a method is described for optimizing the mark recognition order when recognizing multiple alignment marks so that the travel distance of a camera which captures the images of alignment marks will become the shortest. In Japanese Laid-Open Patent Publication 2007-214494, a mark recognition method is described for simultaneously recognizing alignment marks for determining positions and bad marks for showing the quality of individual boards. The contents of Japanese Laid-Open Patent Publication Nos. 2004-214247 and 2007-214494 are incorporated herein by reference in their entirety in the present application.

SUMMARY OF THE INVENTION

According to one aspect of the present invention, a method for recognizing alignment marks includes preparing a substrate having multiple alignment marks including alignment marks positioned adjacent to each other, and recognizing the alignment marks on the substrate by capturing their images using a recognition camera. The recognizing of the alignment marks includes adjusting the position of the recognition camera when capturing images of the alignment marks positioned adjacent to each other such that each of the alignment marks positioned adjacent to each other is positioned equidistant from the center of an image-capturing region of the recognition camera.

According to another aspect of the present invention, a method for manufacturing a printed wiring board includes preparing a substrate having multiple alignment marks including alignment marks positioned adjacent to each other, recognizing the alignment marks on the substrate by capturing their images using a recognition camera, and manufacturing a printed wiring board according to the positions of the alignment marks recognized by the recognition camera. The recognizing of the alignment marks includes adjusting the position of the recognition camera when capturing images of the alignment marks positioned adjacent to each other such that each of the alignment marks positioned adjacent to each other is positioned equidistant from the center of an image-capturing region of the recognition camera.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 10:
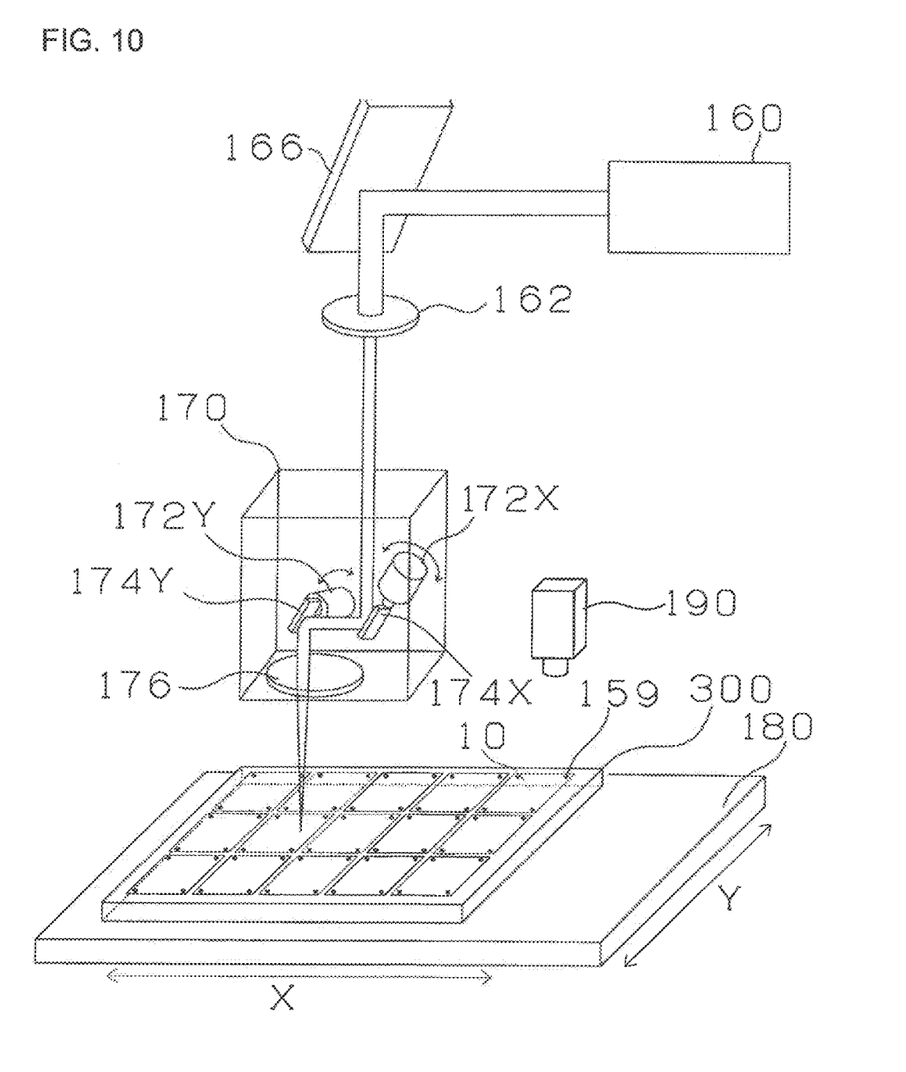
FIG. 10 is a view to illustrate a laser processing apparatus to be used in a method for manufacturing a multilayer printed wiring board.

FIG. 10 shows a laser processing apparatus (direct-imaging exposure apparatus) used in a method for manufacturing a multilayer printed wiring board relating to the first embodiment of the present invention. In the manufacturing method of the first embodiment, multi-piece substrate 300, where printed wiring boards 10 are arranged 3 down and 5 across, is used for processing. Namely, substrate 300 is divided into multiple image rendering regions, each corresponding to a printed wiring board 10. After the process is finished, printed wiring boards 10 are cut out of substrate 300. Multiple printed wiring boards 10 may be separated in bulk from substrate 300, or each printed wiring board 10 may be individually separated from substrate 300. At four corners in the image rendering region of each printed wiring board 10, namely, at four corners of each printed wiring board 10, alignment marks 159 are formed.

The light output from laser oscillator 160 of the laser processing apparatus is reflected at reflector 166 and sent to scan head 170 by way of transfer mask 162 to obtain a sharper focus on the substrate.

Scan head 170 is structured with a pair of galvanometer mirrors; galvanometer mirror (174X) for scanning laser beams in directions X and galvanometer mirror (174Y) for scanning in directions Y. Mirrors (174X, 174Y) are driven by control motors (172X, 172Y). Motors (172X, 172Y) are structured so that angles of mirrors (174X, 174Y) are adjusted in response to control commands from a computer and detection signals are output from the built-in encoders to the computer.

Laser beams pass through two galvanometer mirrors (174X, 174Y) to be scanned in directions (X-Y) respectively, pass through (f-θ) lens 176, reach later-described solder-resist layers in multi-piece substrate 300, and cure areas excluding holes for via holes. Multi-piece substrate 300 is placed on (X-Y) table 80 which moves in directions (X-Y).

In the laser processing apparatus, CCD camera 190 is arranged. The laser processing apparatus is structured in such a way that the positions of alignment marks (marks to determine positions) 159 prepared at four corners of each individual printed wiring board 10 in multi-piece substrate 300 are measured by CCD camera 190, and errors are corrected before processing is started.

Figure 8:
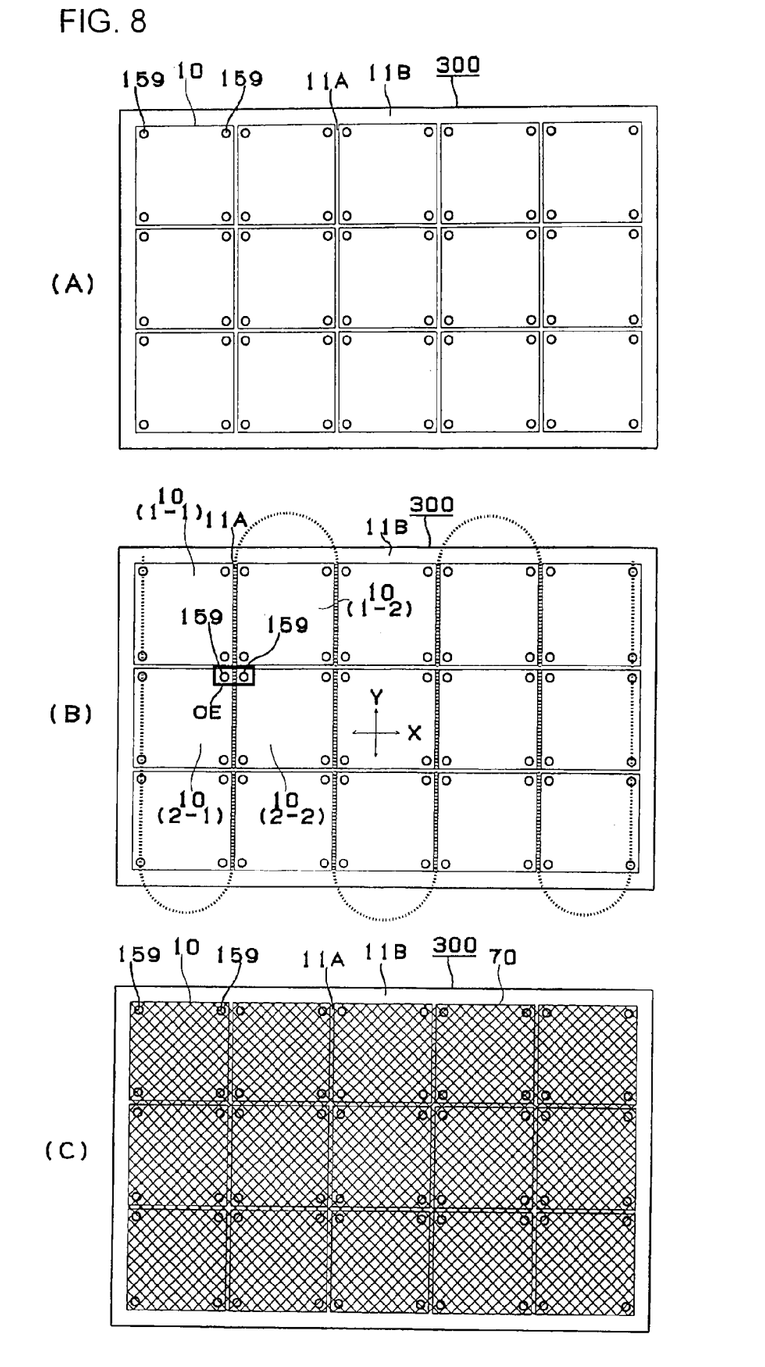
FIGS. 8(A)-(C) are plan views of a multi-piece substrate.
Figure 9:
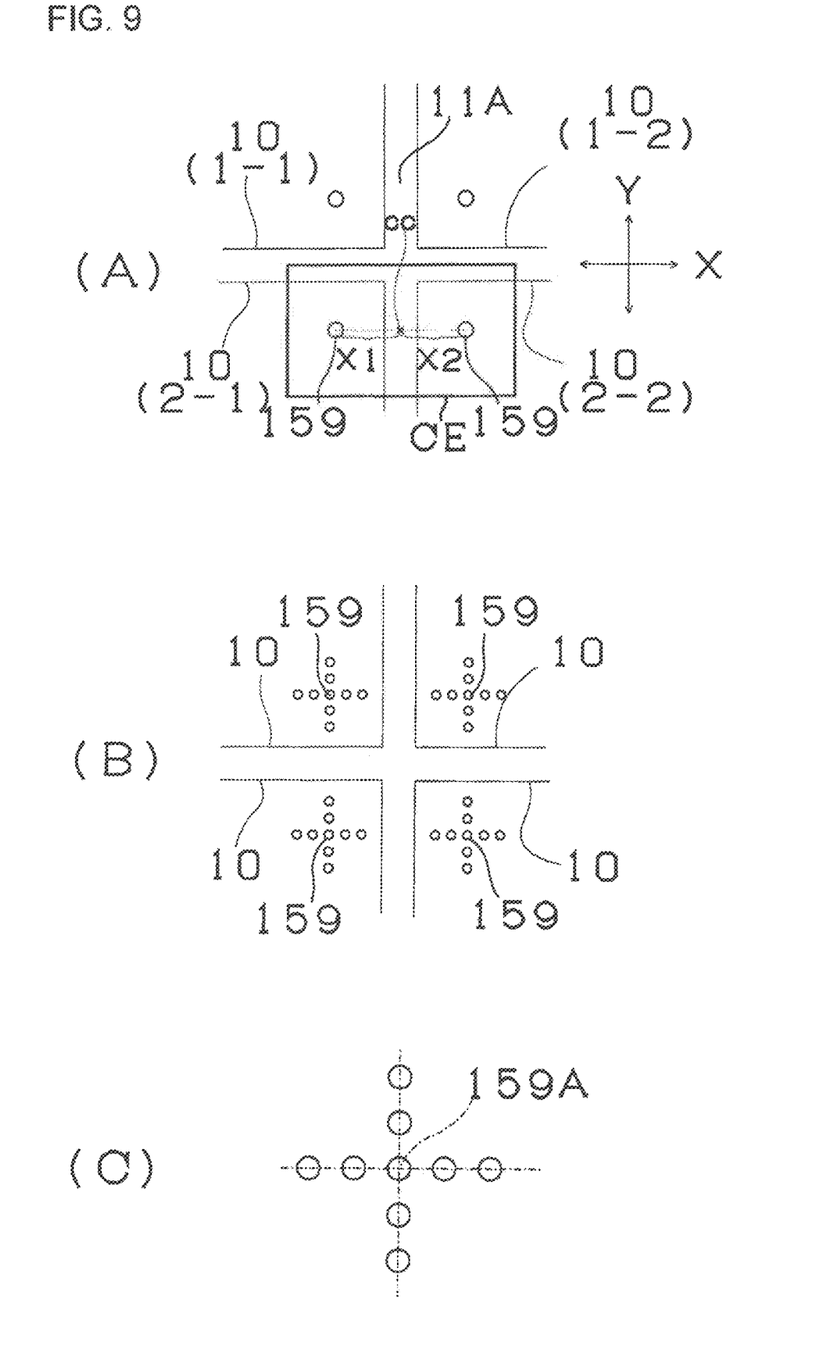
FIGS. 9(A)-(C) are views to illustrate image capturing in a method for manufacturing a multilayer printed wiring board.

Movement of camera 190 to capture images of alignment marks is described with reference to FIGS. 8 and 9. FIG. 8(A) is a plan view of multi-piece substrate 300 shown in FIG. 10. As described above, multi-piece substrate 300 is formed with printed wiring boards 10 being set 3 down and 5 across, cutting margins (11A) are prepared between printed wiring boards 10, and cutting margins (11B) are also prepared on the periphery of multi-piece substrate 300.

FIG. 8(B) shows the movement locus of camera 190 which is used for capturing images of alignment marks. In the drawing, the camera captures images of alignment marks while being transported along a direction Y. When the camera finishes capturing images of alignment marks at an end, the camera is transported in a direction X and begins capturing images of the next row in a direction Y. When capturing images of alignment marks on the left edge or the right edge, the camera moves directly over such alignment marks. Regarding adjacent printed wiring boards 10, the camera moves over the center line of central cutting margin (11A). Then, images of the alignment marks on the image rendering regions of two adjacent printed wiring boards 10, namely, images of two alignment marks positioned next to each other, are simultaneously captured by the camera, and their respective positions are measured. The distance between two adjacent alignment marks is set in such a range that each alignment mark will be positioned within the image-capturing region of the camera.

FIG. 9(A) is a view to illustrate images of an alignment mark of printed wiring board 10 (2-1) and an alignment mark of printed wiring board 10 (2-2) in FIG. 8(B) which are simultaneously captured by the camera. Captured in FIG. 9(A) are the image of alignment mark 159 which is positioned in printed wiring board 10 (2-1) and faces printed wiring board 10 (1-1) and printed wiring board 10 (2-2), and the image of alignment mark 159 which is positioned in printed wiring board 10 (2-2) and faces printed wiring board 10 (1-2) and printed wiring board 10 (2-1). When respectively recognizing two alignment marks (159, 159), the camera position is adjusted so that each alignment mark will be positioned equidistant (X1=X2) from center (cc) of image-capturing region (CE) of the recognition camera, namely, the number of pixels will be the same.

In the method for manufacturing a printed wiring board according to the first embodiment, images of two alignment marks (159, 159) positioned adjacent to each other are simultaneously captured by camera 190. Thus, time required to recognize alignment marks may be reduced compared with situations in which the image of one alignment mark is captured at one time. Here, when two alignment marks are each recognized, the camera position is adjusted so that each alignment mark will be positioned equidistant (X1=X2) from center (cc) of image-capturing region (CE) of the camera. Therefore, the image distortion of each alignment mark will be the same as that of the others, and accuracy in measuring alignment-mark positions will not decrease even if the images of two marks are captured simultaneously. It is preferred that each alignment mark to be captured simultaneously be positioned close to center (cc) of image-capturing region (CE) of the camera. That is because outline distortion of an alignment mark due to the lens shape of a camera becomes less toward the center of the lens. Each alignment mark may be formed with one dot as shown in FIG. 9(A), or with multiple dots as shown in FIGS. 9(B) and 9(C). When each alignment mark is formed with multiple dots, the accuracy in measuring the alignment-mark position may improve compared with situations when each alignment mark is formed with one dot. When each alignment mark is formed with multiple dots, the camera position is adjusted so that dot (159A) at the center of a group of dots forming each alignment mark will be positioned equidistant from center (cc) of image-capturing region (CE) of the camera.

In the method for manufacturing a printed wiring board according to the first embodiment, two alignment marks positioned to be adjacent to each other are formed to have the same configuration and to be a circle with the same size. Therefore, the image of each alignment mark will become the same as that of the others, and the accuracy in measuring alignment-mark positions will not decrease.

Figure 11:
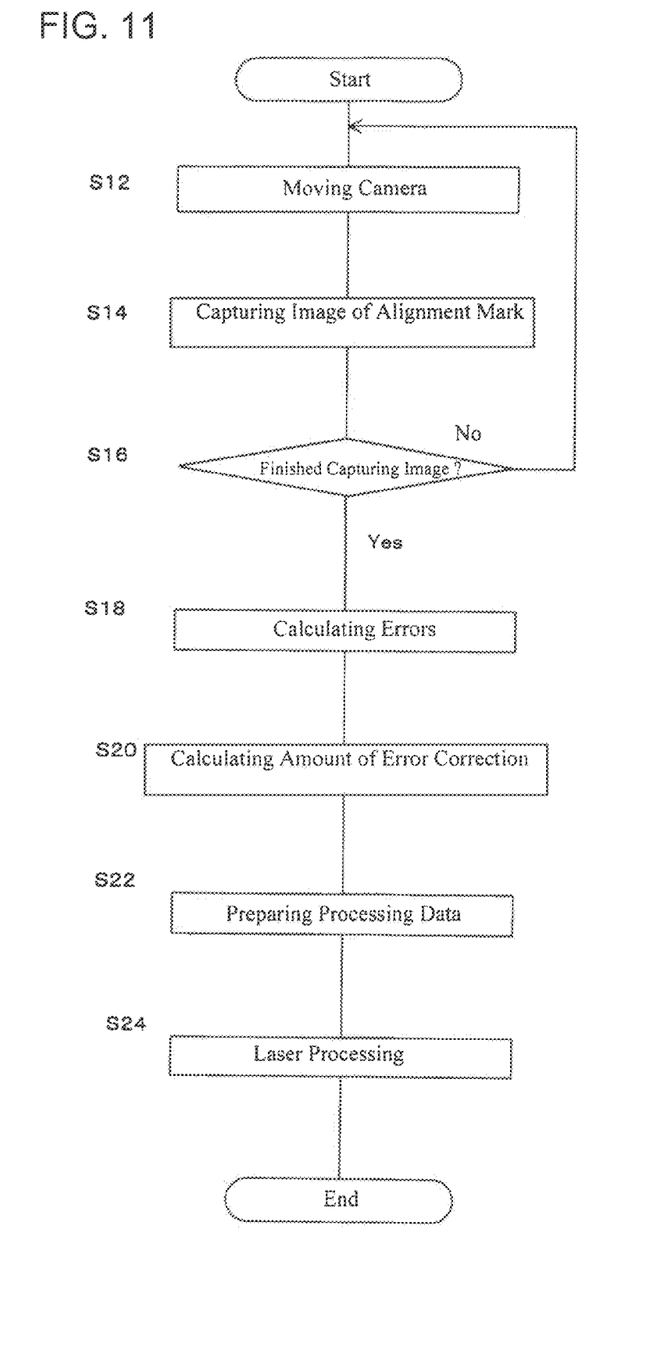
FIG. 11 is a flowchart showing the procedure for preparing processing data in a method for manufacturing a multilayer printed wiring board.

Procedures by a computer for preparing processing data based on the measured positions of alignment marks are described in further detail with reference to the flowchart in FIG. 11. The computer transports a camera (S12) following the locus as described above with reference to FIG. 8(B), captures images of alignment marks, and obtains the positions of alignment marks (S14). Until capturing images of all alignment marks is finished (S16: No), the computer returns to (S12) and continues to capture the images of alignment marks.

When capturing images of all alignment marks is finished (S16: Yes), errors in each printed wiring board, such as the amount of deviation in directions X, the amount of deviation in directions Y, the amount of contraction and the amount of rotation, are calculated from the positions of four alignment marks 159 of each printed wiring board 10 (S18). Then, error-correction amounts to correct the measured errors are prepared (S20). Next, according to the data for error-correction amounts, the computer corrects hole-coordinate data containing the coordinates of holes to be processed, and prepares actual processing data containing the coordinates of holes to be actually opened (S22). Then, according to the processing data, the computer prepares scan-head data to drive galvanometer head 70 as well as prepares table data to drive (X-Y) table 80. According to the data, actual laser processing is performed by driving (X-Y) table 80, laser 60 and galvanometer head 70 (S24).

Figure 1:
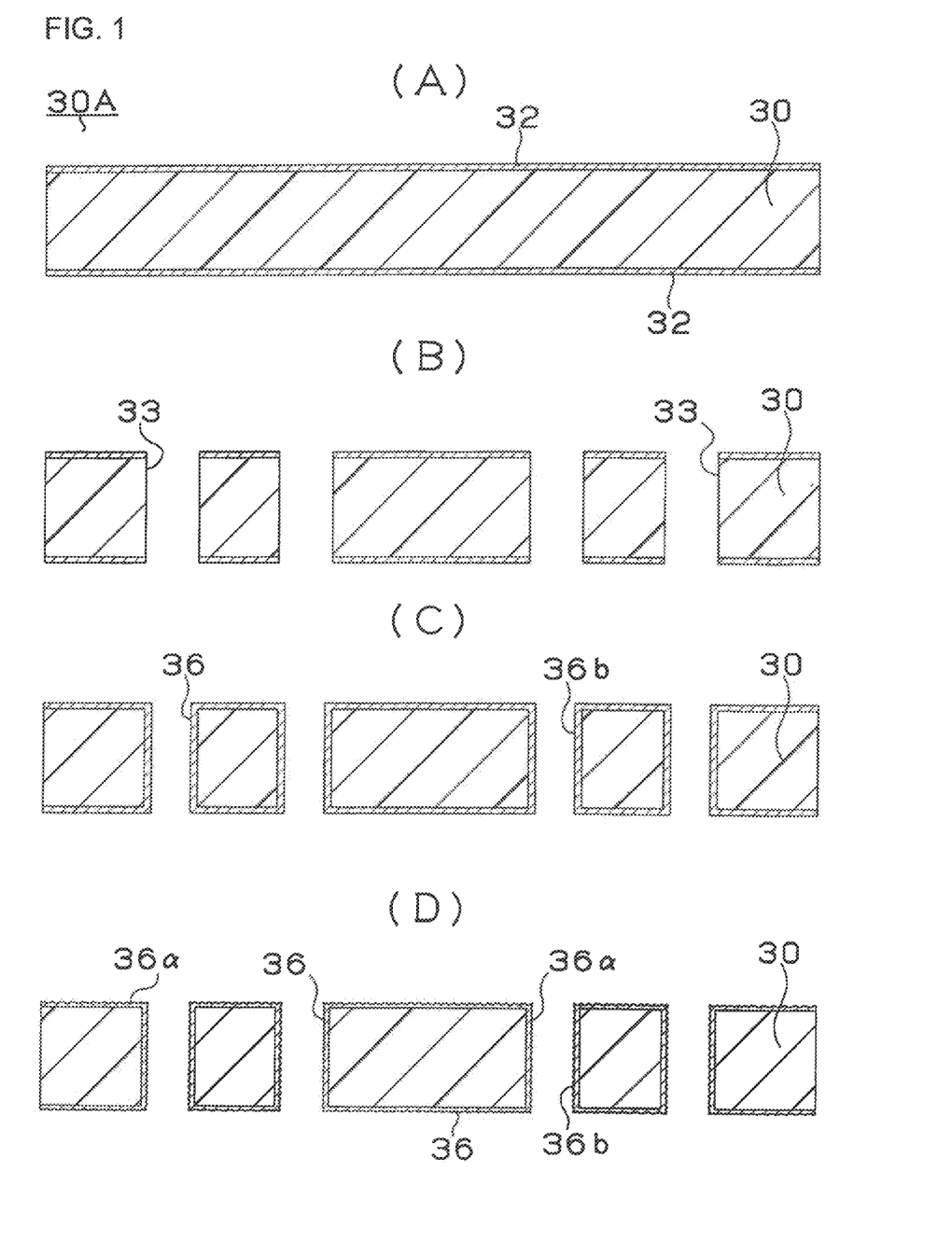
FIGS. 1(A)-(D) are views showing steps of a method for manufacturing a multilayer printed wiring board relating to the first embodiment of the present invention.
Figure 2:
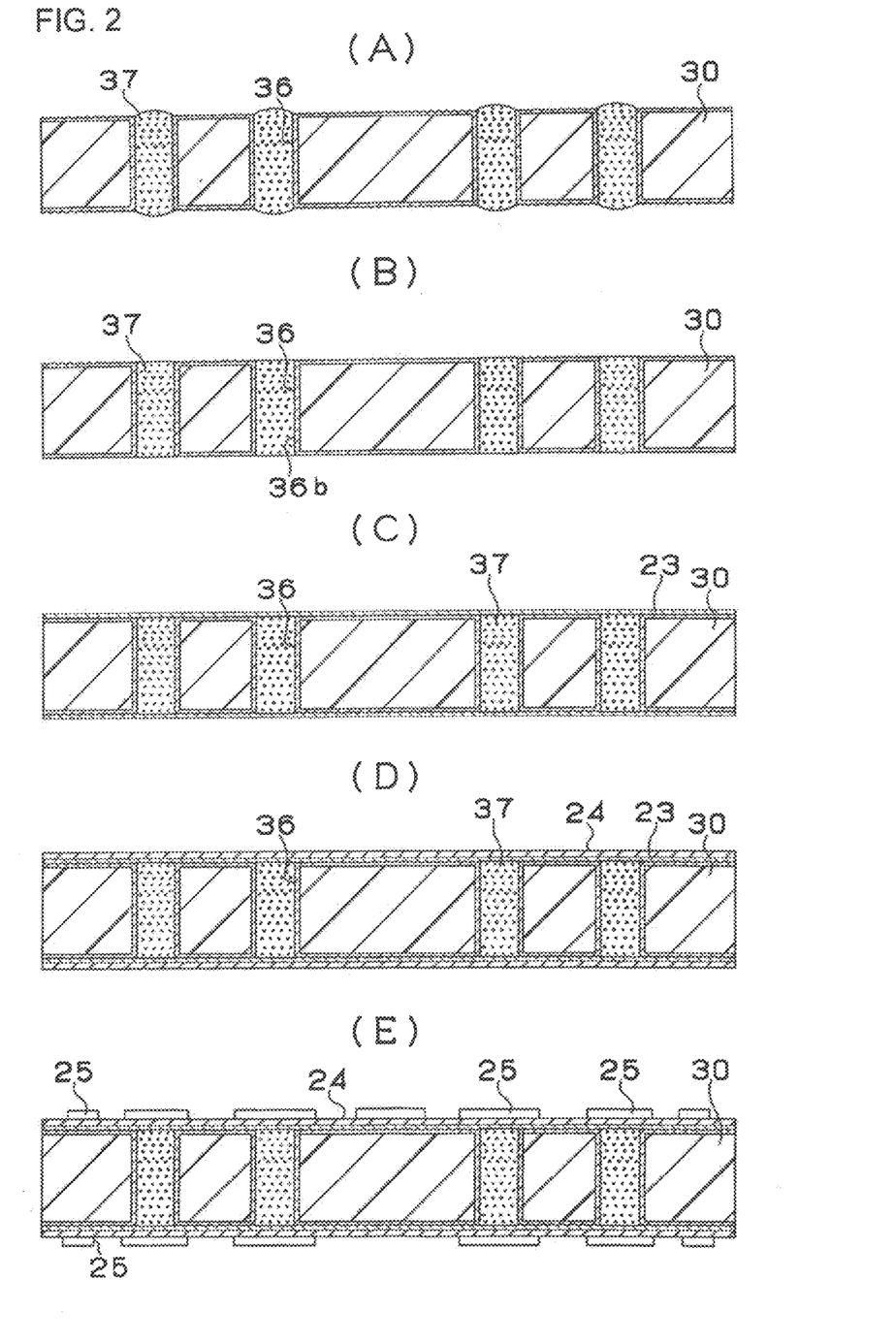
FIGS. 2(A)-(E) are views showing steps of a method for manufacturing a multilayer printed wiring board.
Figure 3:
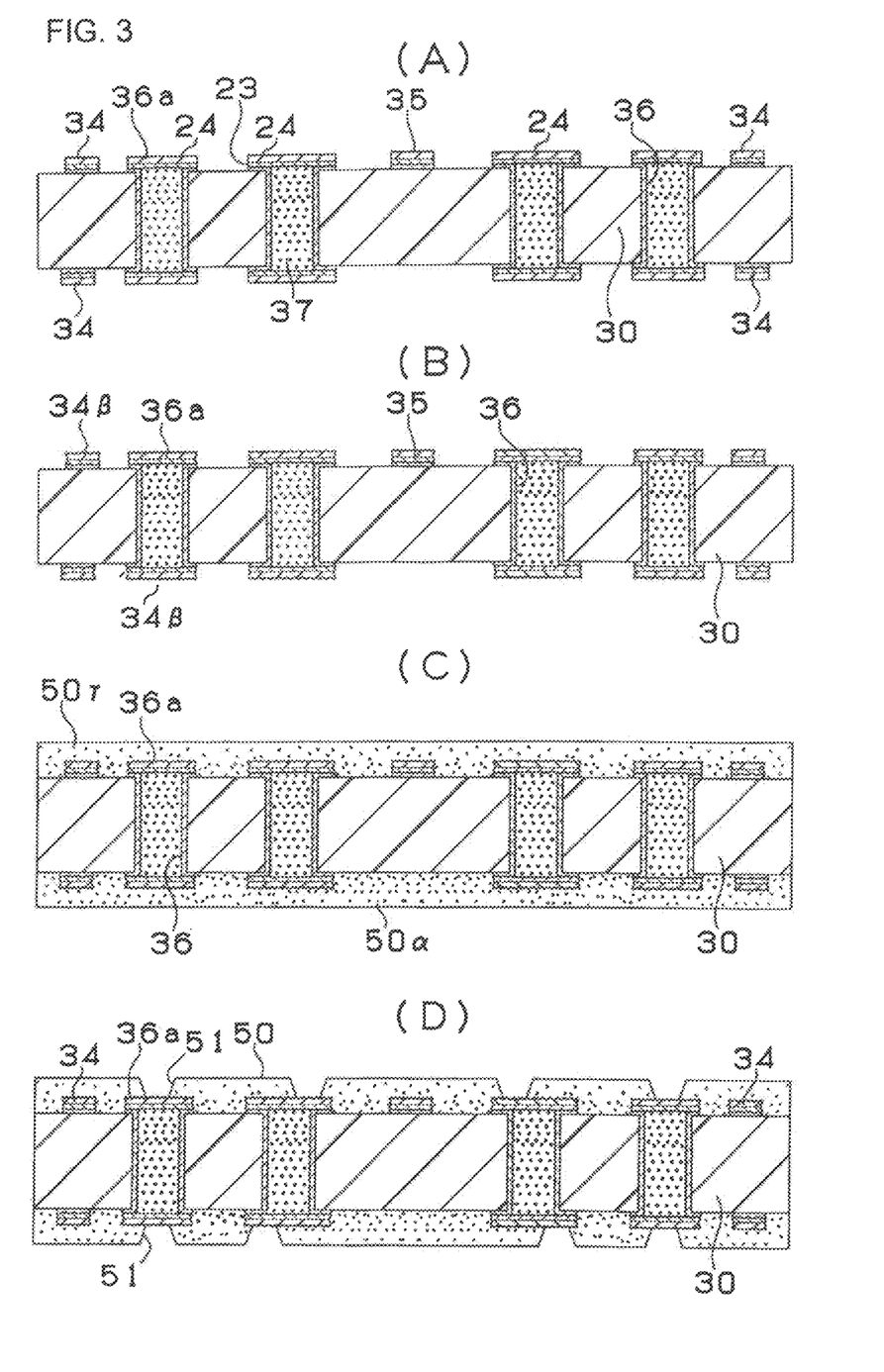
FIGS. 3(A)-(D) are views showing steps of a method for manufacturing a multilayer printed wiring board.
Figure 4:
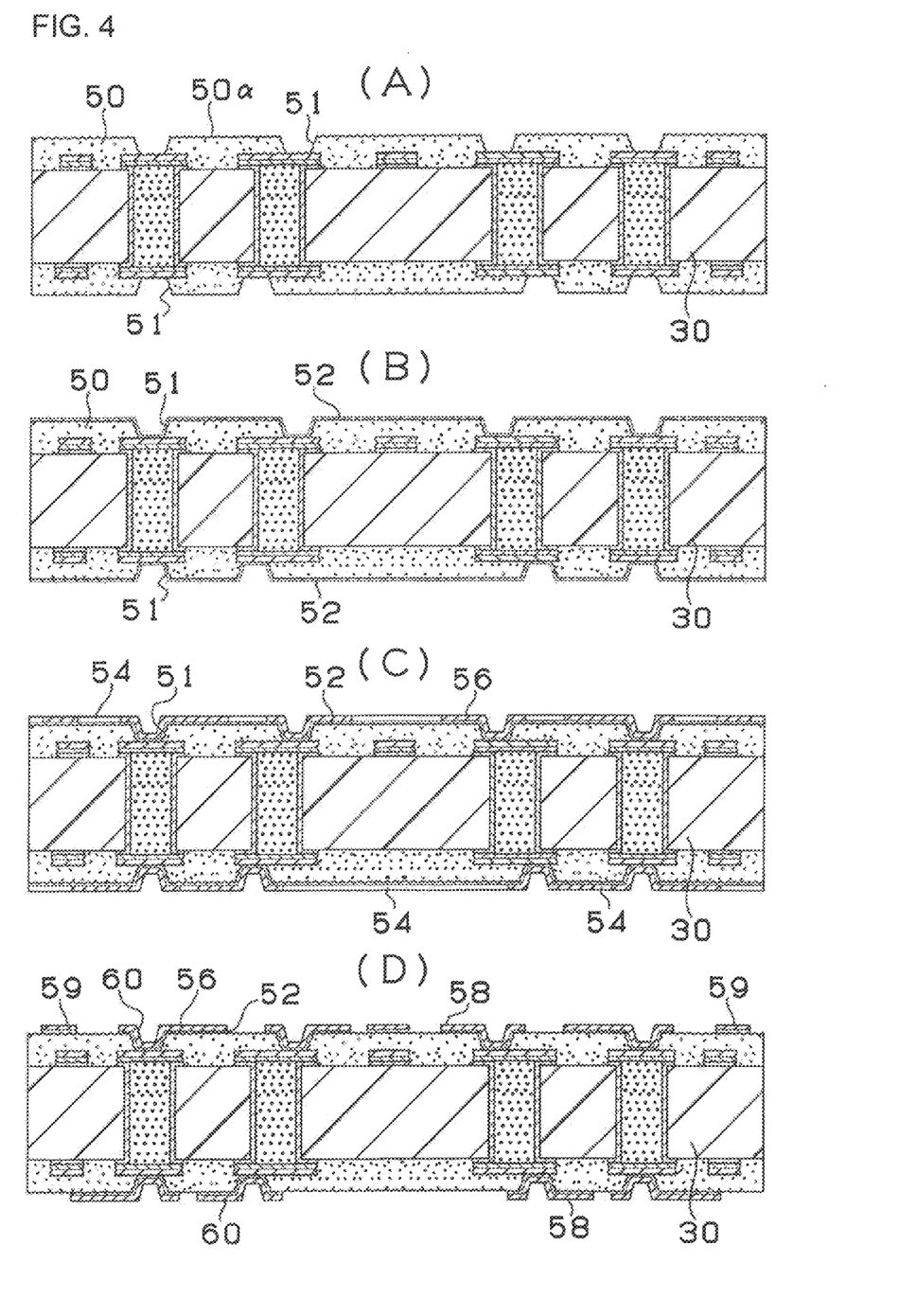
FIGS. 4(A)-(D) are views showing steps of a method for manufacturing a multilayer printed wiring board.
Figure 5:
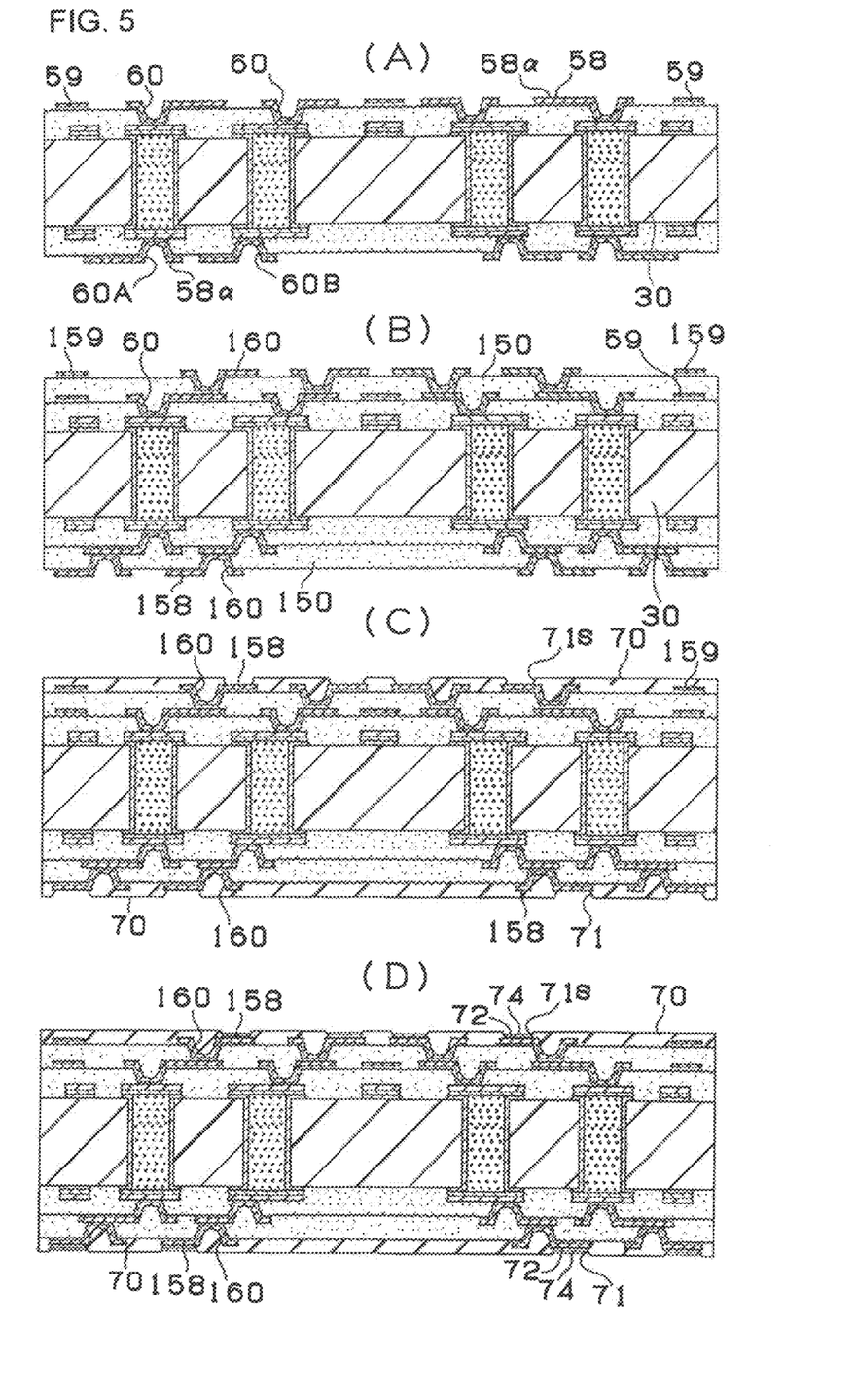
FIGS. 5(A)-(D) are views showing steps of a method for manufacturing a multilayer printed wiring board.
Figure 6:
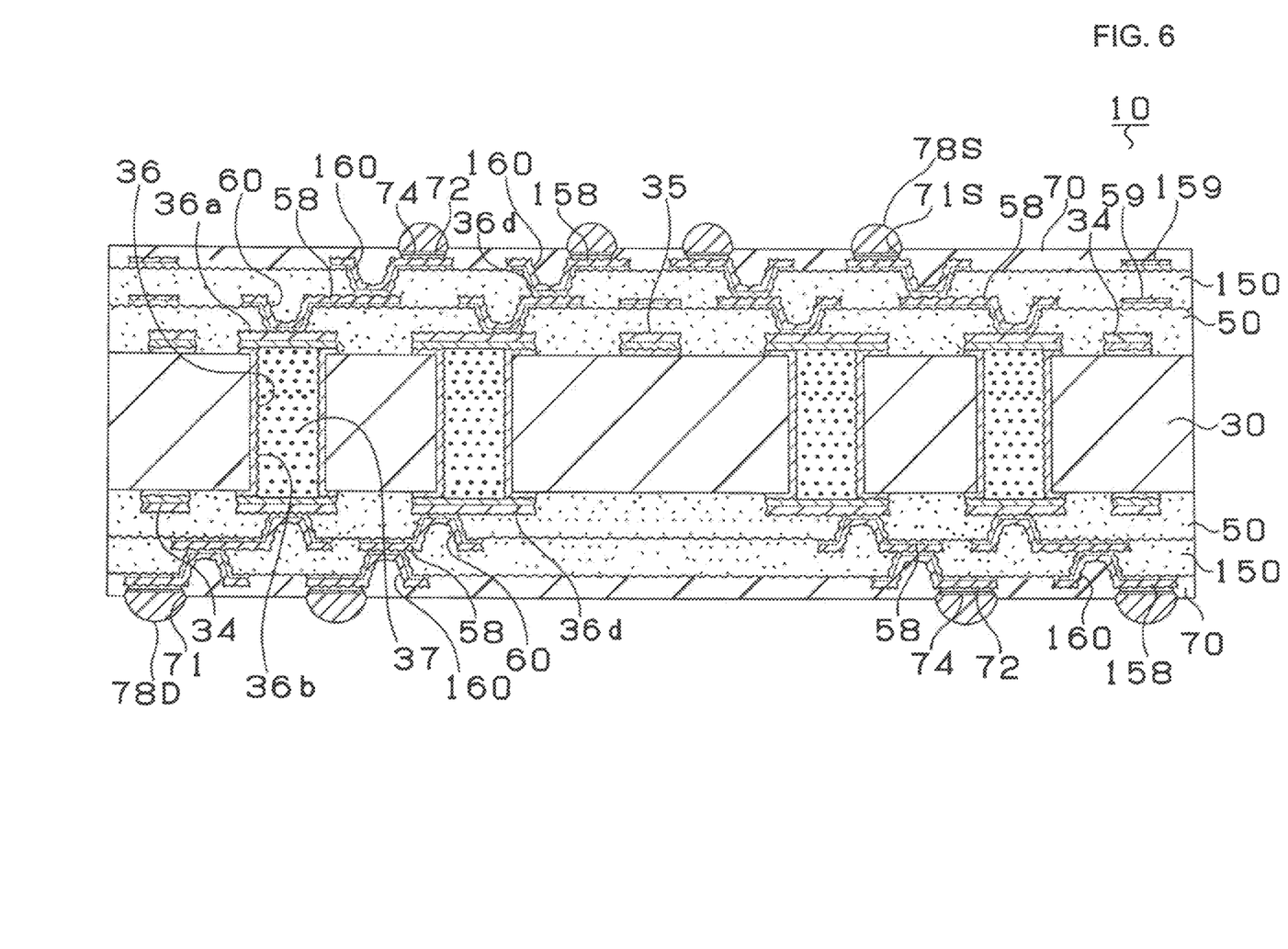
FIG. 6 is a cross-sectional view of a multilayer printed wiring board.
Figure 7:
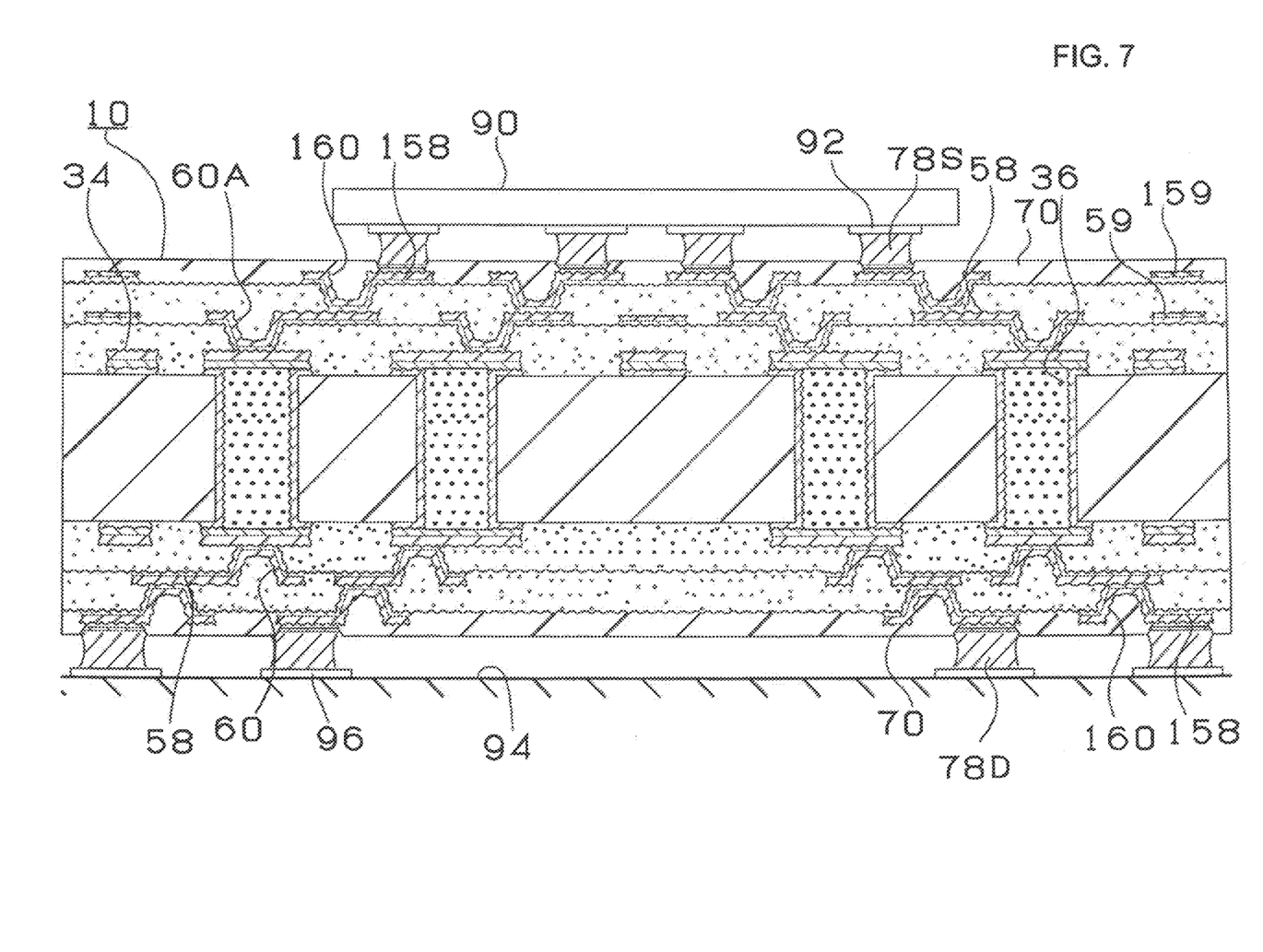
FIG. 7 is a cross-sectional view showing a state where an IC chip is mounted on the multilayer printed wiring board shown in FIG. 6.

Next, the structure of multilayer printed wiring board 10 manufactured by a manufacturing method relating to the first embodiment of the present invention is described with reference to FIGS. 6 and 7. FIG. 6 shows a cross-sectional view of individual multilayer printed wiring board 10 divided from multi-piece substrate 300 described above with reference to FIG. 8(A). FIG. 7 shows a state in which IC chip 90 is mounted on multilayer printed wiring board 10 shown in FIG. 6, and multilayer printed wiring board 102 is mounted on daughterboard 94. In multilayer printed wiring board 10, conductive circuits 34 are formed on the surfaces of core substrate 30 as shown in FIG. 6. The upper surface and the lower surface of core substrate 30 are connected by through holes 36. Formed on core substrate 30 are interlayer resin insulation layers 50 where via holes 60 and conductive circuits 58 are formed and interlayer resin insulation layers 150 where via holes 160 and conductive circuits 158 are formed. As upper layers of via holes 160 and conductive circuits 158, solder-resist layers 70 are formed. In upper-surface solder-resist layer 70, openings (71S) are formed and solder bumps (78S) are arranged. In lower-surface solder-resist layer 70, openings (71) are formed and solder bumps (78D) are arranged.

As shown in FIG. 7, solder bumps (78S) on the upper-surface side of multilayer printed wiring board 10 are connected to pads 92 of IC chip 90. On the other hand, lower-surface side solder bumps (78D) are connected to lands 96 of daughterboard 94.

In the following, the method for manufacturing multilayer printed wiring board 10 described above with reference to FIG. 6 is described by referring to FIGS. 1-5.

(1) Copper-clad laminate (30A) was prepared as a starting material, being made by laminating 5-250 μm-thick copper foil 32 on both surfaces of insulative substrate 30 made of 0.2-0.8 mm-thick glass epoxy resin or BT (bismaleimide triazine) resin (FIG. 1(A)). First, through holes 33 were bored by drilling the copper-clad laminate (FIG. 1(B)), then electroless plating and electrolytic plating were performed to form side-wall conductive layer (36b) in through holes 36 (FIG. 1(C)).

(2) Substrate 30 having through holes 36 was washed with water and dried. Then, a black-oxide treatment and reduction treatment were conducted. Accordingly, roughened surfaces (36α) were formed on side-wall conductive layers (36b) in through holes 36 and on the surfaces (FIG. 1(D)).

(3) Next, filler 37 containing copper particles with an average particle diameter of 10 μm (non-conductive copper paste for hole filling, brand name: DD Paste, made by Tatsuta Electric Wire & Cable Co., Ltd.) was filled in through holes 36 by screen printing, dried and cured (FIG. 2(A)).

Next, filler 37 bulging from through holes 36 was removed by belt-sander polishing using #600 belt polishing paper (made by Sankyo Rikagaku Co., Ltd.). In addition, buff polishing was conducted to remove scratches caused by belt-sander polishing and the surfaces of substrate 30 were leveled (see FIG. 2(B)).

(4) On the surfaces of substrate 30 leveled in (3) above, a palladium catalyst (made by Atotech) was attached, electroless copper plating was performed, and 0.6 μm-thick electroless-copper plated films 23 were formed (see FIG. 2(C)).

(5) Next, electrolytic copper plating was performed, and 15 μm-thick electrolytic copper-plated films 24 were formed to thicken the areas to become conductive circuits 34 and to form plated cover layers (through-hole lands) which cover filler 37 filled in through holes 36 (FIG. 2(D)).

(6) On both surfaces of substrate 30 where portions to become conductive circuits and plated cover layers were formed, a commercially available photosensitive dry film was laminated to form etching resists 25 (see FIG. 2(E)).

(7) Then, plated films (23, 24) and copper foil 32 on areas where no etching resist 25 was formed were dissolved and removed by an etching solution, and etching resists 25 were further removed. Accordingly, independent conductive circuits 35, alignment marks 34 and plated cover layers (36a) that cover filler 37 were formed (see FIG. 3(A)).

(8) Next, on the surfaces of conductive circuits 35, alignment marks 34 and plated cover layers (36a) that cover filler 37, 2.5 μm-thick roughened layers (uneven layers) (34β) made of Cu-Ni-P alloy were formed. Furthermore, on the surfaces of roughened layers (343), a 0.3 μm-thick Sn layer was formed (see FIG. 3(B); Sn layer omitted).

(9) On both surfaces of substrate 30, resin film for interlayer resin insulation layers (brand name: ABF-45SH, made by Ajinomoto) (50γ) with a little larger size than substrate 30 was placed, preliminarily pressed and cut to size. After that, by laminating the film using vacuum laminator equipment, interlayer resin insulation layers 50 were formed (FIG. 3(C)).

(10) Next, alignment marks 34 under lower interlayer resin insulation layers 50 were measured by a camera the same way as were alignment marks 159 on outermost interlayer resin insulation layers described above with reference to FIG. 8(B). Based on the alignment marks, via-hole openings 51 were formed in interlayer resin insulation layers 50 by using a CO2 gas laser (FIG. 3(D)).

(11) The substrate having via-hole openings 51 was immersed for 10 minutes in an 80° C. solution containing 60 g/l permanganic acid. Then, by removing particles remaining on the surfaces of interlayer resin insulation layers 50, roughened surfaces (50α) were formed on interlayer resin insulation layers 50 including the inner walls of via-hole openings 51 (FIG. 4(A)).

(12) Next, after the above treatment the substrate was immersed in a neutralizer (made by Shipley Company, LLP) and then washed with water. Furthermore, by attaching a palladium catalyst to the surfaces of the substrate where roughening treatment was conducted (roughened depth of 3 μm), catalyst nuclei were attached to the surfaces of interlayer resin insulation layers and inner-wall surfaces of via-hole openings.

(13) Next, the substrate with attached catalyst was immersed in an electroless copper plating solution (Thru-Cup PEA) made by C. Uyemura & Co., Ltd. to form a 0.3-3.0 μm-thick electroless copper-plated film entirely on roughened surfaces. Accordingly, a substrate was obtained, where electroless copper-plated film 52 was formed on the surfaces of interlayer resin insulation layers 50 including the inner walls of via-hole openings 51 (FIG. 4(B)).

(14) A commercially available photosensitive dry film was laminated on the substrate having electroless copper-plated film 52. A mask was placed on the film, which was exposed to light and developed. Accordingly, 25 μm-thick plating resists 54 were formed. Then, after the substrate was degreased, washed with water and further cleansed with sulfuric acid, electrolytic plating was performed to form 15 μm-thick electrolytic copper-plated film 56 on areas where plating resist 54 was not formed (FIG. 4(C)).

(15) Furthermore, after plating resists 54 were removed, the electroless plated film under the plating resists was dissolved and removed by etching to form independent conductive circuits 58, alignment marks 59 and via holes 60 (FIG. 4(D)).

(16) Then, the same treatment was conducted as in (4) above and roughened surfaces (58α) were formed on the surfaces of conductive circuits 58 and via holes 60 (FIG. 5(A)).

(17) By repeating above steps (9)-(16), further upper-layer interlayer insulation layers 150 having conductive circuits 158, alignment marks 159 and via holes 160 were formed, and a multilayer wiring board was obtained (FIG. 5(B)). When conductive circuits 158, alignment marks 159 and via holes 160 were formed, their positions were determined by capturing images of alignment marks 59 on interlayer resin insulation layers 50 by a camera the same as with alignment marks 159 on outermost interlayer resin insulation layers described above with reference to FIG. 8(B).

(18) Next, as described above with reference to FIGS. 8(B) and 11, images of alignment marks 159 on outermost interlayer resin insulation layers 150 on multi-piece substrate 300 were captured. Then, on both surfaces of multi-piece substrate 300, a commercially available solder-resist composition was applied to be 20 μm thick, and dried (FIG. 8(C)). Next, as described above by referring to (S18)-(S24) in FIG. 11, a laser was beamed on the solder-resist composition to cure the solder resist in areas excluding openings. After that, by removing uncured portions of the solder resist using a chemical solution, 15-25 μm-thick solder-resist pattern layers having openings (71S, 71) were formed (FIG. 5(C)).

(19) Next, the substrate having solder-resist layers 70 was immersed in an electroless nickel plating solution and 5 μm-thick nickel-plated layer 72 was formed in opening portions (71S, 71). Furthermore, the substrate was immersed in an electroless gold plating solution, and 0.03 μm-thick gold-plated layer 74 was formed on nickel-plated layer 72 to form solder pads (FIG. 5(D)). Instead of nickel-gold layers, nickel-palladium-gold layers may also be formed.

(21) After that, solder balls were mounted in opening portions (71S, 71) respectively in solder-resist layers, and the solder balls were fused by a reflow at 230° C. Accordingly, solder bumps (78S, 78D) were formed (FIG. 6).

IC chip 90 was mounted on multilayer printed wiring board 10 and reflowed, and pads 92 of IC chip 90 were connected to multilayer printed wiring board 10 by means of solder bumps (78S). Then, multilayer printed wiring board 10 was mounted on daughterboard 94 by means of solder bumps (78D) (FIG. 7).

In printed wiring boards of the first embodiment, thermal contraction occurs each time interlayer resin insulation layers and conductive layers are built up on a core substrate during the manufacturing process, causing local distortion to build up in the multi-piece substrate for obtaining multiple printed wiring boards. Here, when outermost interlayer resin insulation layers 150 are formed, such distortion becomes the greatest. When solder-resist layers are placed on outermost interlayer resin insulation layers 150, opening positions for solder pads are adjusted in each printed wiring board based on alignment marks 159 on outermost interlayer resin insulation layers 150. Therefore, openings may be prepared at the correct positions in each printed wiring board.

Second Embodiment

Figure 13:
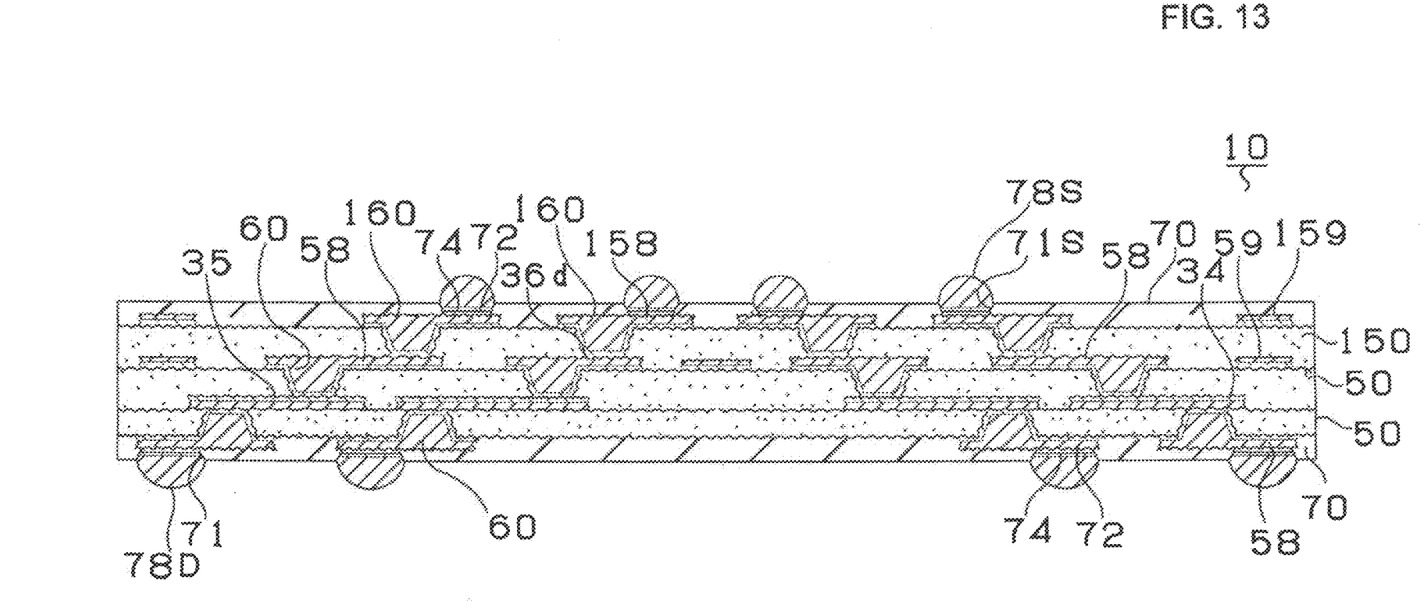
FIG. 13 is a cross-sectional view of a multilayer printed wiring board relating to the second embodiment.

A multilayer printed wiring board relating to the second embodiment of the present invention is described with reference to FIG. 13. In a multilayer printed wiring board relating to the first embodiment, interlayer resin insulation layers and conductive circuits were laminated on both surfaces of a core substrate. By contrast, in the second embodiment, a multilayer printed wiring board is structured as a coreless board that does not have a core substrate. Interlayer resin insulation layers 50 having via holes 60 and conductive circuits 58 are formed to sandwich conductive circuits 35, and interlayer resin insulation layer 150 having via holes 160 and conductive circuits 158 is further formed on the upper-surface side.

Figure 12:
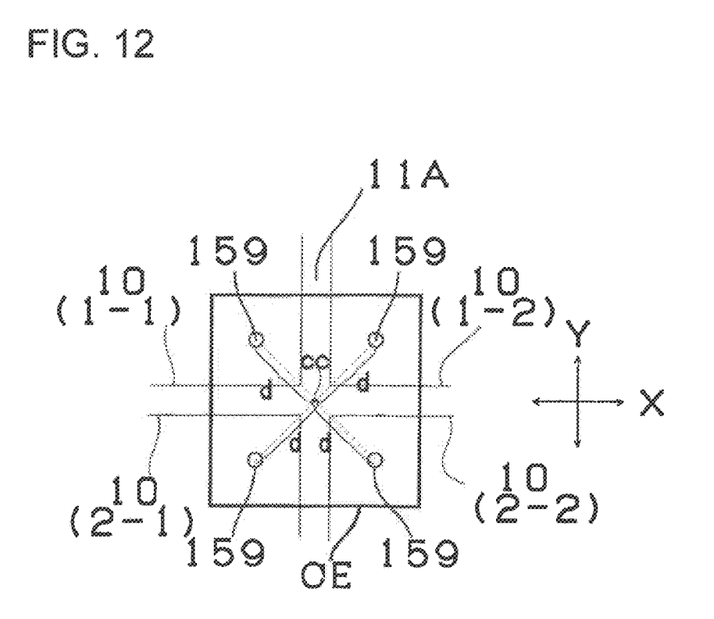
FIG. 12 is a view to illustrate image capturing in a method for manufacturing a multilayer printed wiring board relating to the second embodiment.

Recognizing alignment marks in a method for manufacturing a printed wiring board relating to the second embodiment is described with reference to FIG. 12. In the first embodiment, images of alignment marks of two adjacent printed wiring boards were simultaneously captured by a camera. By contrast, as shown in FIG. 12, images of alignment marks (159, 159, 159, 159) of four adjacent printed wiring boards 10 (1-1), 10 (1-2), 10 (2-1) and 10 (2-2) are simultaneously captured by a recognition camera. Here, when four alignment marks are each recognized, the camera position is adjusted so that each alignment mark will be located equidistant (distance (d)) from center (cc) of image-capturing region (CE) of the recognition camera.

In the method for manufacturing a printed wiring board according to the second embodiment, images of four adjacent alignment marks (159, 159, 159, 159) of four adjacent printed wiring boards are simultaneously captured by camera 190. Thus, the time required to recognize alignment marks may be reduced. Here, when four alignment marks are each recognized, the camera position is adjusted so that each alignment mark will be located equidistant (d) from center (cc) of image-capturing region (CE) of the camera. Therefore, image distortion of each alignment mark will be the same, and accuracy in measuring alignment-mark positions will not decrease. In the second embodiment, images of four alignment marks are simultaneously captured. However, images of two alignment marks may be captured simultaneously the same as in the first embodiment. In the same manner, images of four alignment marks may also be captured in the first embodiment. Namely, in the present invention, the number of alignment marks whose images are captured simultaneously is not limited to any specific number. It is sufficient as long as images of multiple alignment marks positioned adjacent to each other are captured simultaneously. The greater the number of alignment marks whose images are simultaneously captured, the shorter the time required to recognize such alignment marks. Also, the configuration of each alignment mark is not limited specifically in each embodiment. Instead of a circle, a rectangle, for example, may also be employed as the configuration of alignment marks, stretched along vertical directions (up-and-down directions in FIG. 9(A)) or along horizontal directions (right-and-left directions in FIG. 9(A)) of image-capturing region (CE). The configuration and size of alignment marks are preferred to be those having less outline distortion in alignment marks caused by the lens configuration of a camera.

Potential Industrial Use

In the above embodiments, a method for recognizing alignment marks of the present invention was applied to forming solder-resist layers in the steps for manufacturing built-up multilayer wiring boards. However, a method for recognizing alignment marks of the present invention may also be applied to forming interlayer insulation layers, for example. Moreover, a method for recognizing alignment marks of the present invention may be used for manufacturing something other than built-up multilayer wiring boards. Namely, a method for recognizing alignment marks of the present invention may be applied to any usage which requires capturing images of adjacent alignment marks by a recognition camera.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   preparing a substrate having a plurality of alignment marks including alignment marks positioned adjacent to each other;
   recognizing the alignment marks on the substrate by capturing images of the alignment marks using a recognition camera; and
   manufacturing a printed wiring board according to positions of the alignment marks recognized by the recognition camera, wherein the recognizing of the alignment marks comprises adjusting a position of the recognition camera when capturing images of the alignment marks positioned adjacent to each other such that each of the alignment marks positioned adjacent to each other is positioned equidistant from a center of an image-capturing region of the recognition camera, the printed wiring board has interlayer resin insulation layers and conductive layers which are laminated and solder-resist layers which are formed on an outermost interlayer resin insulation layers, and the solder-resist layers are formed based on the positions of the alignment marks recognized by the recognition camera.

2. The method for manufacturing a printed wiring board according to claim 1, further comprising preparing a substrate which is divided into a plurality of image rendering regions corresponding to a plurality of printed wiring boards and has alignment marks corresponding to each of the image rendering regions, respectively.

3. The method for manufacturing a printed wiring board according to claim 1, wherein the alignment marks positioned adjacent to each other have a same configuration and a same size.

4. The method for manufacturing a printed wiring board according to claim 2, wherein the alignment marks positioned adjacent to each other have a same configuration and a same size.

\* \* \* \* \*